United States Patent
Lee et al.

(10) Patent No.: US 6,723,640 B2
(45) Date of Patent: Apr. 20, 2004

(54) METHOD FOR FORMING CONTACT PLUG OF SEMICONDUCTOR DEVICE

(75) Inventors: Sung-Kwon Lee, Ichon-shi (KR); Dong-Sauk Kim, Ichon-shi (KR); Hyung-Soon Park, Ichon-shi (KR); Ho-Seok Lee, Ichon-shi (KR); Sang-Ik Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,984

(22) Filed: Dec. 31, 2002

(65) Prior Publication Data
US 2004/0002209 A1 Jan. 1, 2004

(30) Foreign Application Priority Data

Jun. 29, 2002 (KR) .............................. 10-2002-0037255
Jul. 19, 2002 (KR) .............................. 10-2002-0042341

(51) Int. Cl.$^7$ .............................................. H01L 21/44
(52) U.S. Cl. ................. 438/672; 438/692; 257/E21.168
(58) Field of Search .............................. 438/672, 692; 257/E21.168

(56) References Cited

U.S. PATENT DOCUMENTS

| 5,231,055 A | * | 7/1993 | Smith ........................ 438/627 |
| 5,552,346 A | * | 9/1996 | Huang et al. ............... 438/699 |
| 6,274,509 B1 | * | 8/2001 | Hsieh et al. ................ 438/761 |

* cited by examiner

Primary Examiner—George Fourson
Assistant Examiner—Thanh V Pham
(74) Attorney, Agent, or Firm—Birch, Stewart, Kolasch & Birch, LLP

(57) ABSTRACT

The present invention provides a method for forming a contact plug of a semiconductor device capable of preventing an attack to conductive patterns. The method includes the steps of: forming a plurality of conductive patterns on a substrate; forming an insulating layer on top of an entire structure including the plurality of the conductive pattern; forming a contact hole by selectively etching the insulating layer; forming a conductive layer for a contact plug on the entire structure including the contact hole; forming a metal sacrificial layer on the entire structure including the conductive layer; exposing the conductive layer by performing an etchback process to the metal sacrificial layer, wherein the metal sacrificial layer is left on a lower topology area induced by the conductive patterns; and forming plugs, each being isolated by polishing the remained metal sacrificial layer, the conductive layer and the insulating layer through the use of slurry.

7 Claims, 8 Drawing Sheets

CELL AREA | PERIPHERAL CIRCUIT AREA

CELL AREA | PERIPHERAL CIRCUIT AREA

METHOD FOR FORMING CONTACT PLUG OF SEMICONDUCTOR DEVICE

This nonprovisional application claims priority under 35 U.S.C. Å119(a) on Patent Application No. 2000-37255 and 2000-42341 filed in Republic of Korea on Jun. 29, 2002 and Jul. 19, 2002, respectively, which is herein incorporated by reference.

1. Field of the Invention

The present invention relates to a method for fabricating a semiconductor device; and, more particularly, to a method for forming a contact plug of a semiconductor device capable of reducing step coverage between a highly dense pattern area, i.e., a cell area and a lowly dense pattern area, i.e., a peripheral circuit area.

2. Description of Related Arts

As integration of a semiconductor device has been augmented progressively, a vertical array structure is applied to a unit device. Particularly, a technique for forming a contact plug is adapted and applied to make an electric connection between the unit devices. Currently, this technique for forming a contact plug has been generalized in a semiconductor device fabrication process.

During the contact plug formation, it is necessary to apply a planarization process such as a chemical mechanical polishing (hereinafter referred as to CMP) process or an etchback process in order to isolate contact plugs.

In addition, there inevitably occurs a step difference between insulating layers in a highly dense pattern area and a lowly dense pattern area, i.e., a cell area and a peripheral circuit area, respectively. Therefore, it is necessary to perform sufficiently a flow process which accompanies a high temperature process in order to reduce the step difference.

However, the high temperature process is hardly applicable because it causes properties of a sub-device such as a gate electrode, a junction between a source and a drain and so forth to be degraded. For instance, leakage currents increase due to a decrease in a gate voltage. Although it is attempted to use a flowable dielectric material having an excellent properties of planarization and gap-fill, there results in a problem of micro-pores produced at a bottom structure during the gap-fill procedure. For this reason, this attempt has also a difficulty in applying to a semiconductor device fabrication process.

FIGS. 1A to 1C are cross-sectional views showing a process for forming a contact plug of a semiconductor device according to a prior art.

Particularly, FIG. 1A illustrates a state in that a number of gate electrode patterns are formed in a cell area and a peripheral circuit area. The following will describe procedures for a contact plug formation process in detail.

A semiconductor substrate 10 wherein various elements for fabricating a semiconductor device are prepared is divided into a cell area and a peripheral circuit area. On the substrate 10, a field oxide layer (not shown) is formed to classify an activation area and a device separation area through a local oxidation of silicon (hereinafter referred as to LOCOS) process or a shallow trench isolation (hereinafter referred as to STI) process.

A number of conductive patterns neighboring upon the activation area, e.g., a number of gate electrode patterns, are formed. That is, an oxide layer based gate insulating layer 11 is deposited, and a gate electrode 12 is formed thereon by depositing a single or combinations of a metal layer using tungsten, a metal nitride layer using a tungsten nitride layer and a metal silicide such as tungsten silicide or polysilicon. After the formation of the gate electrode 12, an insulating layer to be used for a nitride layer based hard mask is deposited.

Subsequently, a photoresist pattern (not shown) for forming the gate electrode pattern is formed. Afterwards, the insulating layer to be used for the hard mask, the gate electrode material and the gate oxide layer are selectively etched by using the gate electrode pattern as an etching mask so as to form the gate electrode pattern in a stack structure including the gate oxide layer based insulating layer 11, the gate electrode 12 and the hard mask 13.

Along an overall profile wherein the gate electrode pattern is formed, a nitride layer based insulating layer 14 to be used for a spacer is thinly deposited. Herein, the reason for using the nitride based material is to provide an etching selection ratio with the oxide layer during a self align contact (hereinafter referred as to SAC) process for forming a contact plug and to prevent losses of the gate electrode pattern when performing the etching process.

In continuous to the deposition of the nitride layer based insulating layer 14, a boro phospho silicate glass (BPSG) layer is deposited to form another insulating layer 15 for insulating an inter-layer by sufficiently covering the gate electrode pattern and an upper part of the substrate 10. Meanwhile, since the peripheral circuit area has a lower vertical height than the cell area because of a difference in densities of patterns in the cell area and the peripheral circuit area, there results in a step difference between the two areas as denoted X in FIG. 1A.

Next, a cell contact open mask (not shown) for forming a contact plug or a contact pad for electrically connecting devices, which will be formed on the upper structure through a subsequent process, is formed on the substrate 10 between the gate electrode patterns, more particularly, a junction between a source and a drain within the substrate 10. Then, the insulating layer 15 is selectively etched by using the cell contact open mask as an etching mask so as to form a contact hole for opening a surface of the substrate 10 between the gate electrode patterns. A conductive material, e.g., polysilicon doped with impurities is deposited as sufficient as to contact to the opened surface of the substrate 10 and fill the contact hole so that a contact plug 16 is formed in the end. FIG. 1B is a cross-sectional view illustrating the above process.

An etchback process or a CMP process is instigated to planarize the contact plug 16 and the insulating layer 15 for isolating each contact plug 16 formed.

At this time, it is also possible to planarize the above with the hard mask 13 or a portion of the insulating layer 15 higher than the hard mask 13.

In the mean time, the described insulating layer 15 mainly uses the BPSG layer. However, during the CMP process, the BPSG layer has a higher removal rate than the polysilicon, which is used for the contact plug 16, and this factor results in a difficulty in controlling the removal during the etching process. Also, in case of applying the planarization process by taking the cell area as a basis for an etching target until exposing a surface of the hard mask 13, e.g., the CMP process for isolating each contact plug 16, there results in an attack to the gate electrode pattern in the peripheral circuit area. This case is expressed as 'A' in FIG. 1C, which is a cross-sectional view showing the loss of the hard mask 13.

FIG. 2 is a scanning electron microscopy (SEM) picture illustrating a contact plug of a semiconductor device fabricated in accordance with the method.

In case of proceeding the planarization process by taking the peripheral circuit area as a basis for an etching target in order to block the attack to the gate electrode pattern in the peripheral circuit area, it is, however, impossible to isolate each plug 16.

Consequently, it is urgently required to develop a special technology for solving the problems in that the BPSG based insulating layer has a higher removal rate than the polysilicon and the attack to the gate electrode patterns caused by the step difference between the cell and the peripheral circuit areas.

SUMMARY OF THE INVENTION

It is, therefore, an object of the present invention to provide a method for forming a contact plug of a semiconductor device suitable for blocking an attack to substructures such as conductive patterns, caused by an unequal etching rate of an insulating layer and a step difference between a highly dense pattern area and a lowly dense pattern area.

In accordance with an aspect of the present invention, there is provided a method for forming a contact plug of a semiconductor device, comprising the steps of: forming a plurality of conductive patterns on a substrate; forming an insulating layer on top of an entire structure including the plurality of the conductive pattern; forming a contact hole by selectively etching the insulating layer; forming a conductive layer for a contact plug on the entire structure including the contact hole; forming a metal sacrificial layer on the entire structure including the conductive layer; exposing the conductive layer by performing an etchback process to the metal sacrificial layer, wherein the metal sacrificial layer is left on a lower topology area induced by the conductive patterns; and forming plugs, each being isolated by polishing the remained metal sacrificial layer, the conductive layer and the insulating layer through the use of slurry.

In accordance with another aspect of the present invention, there is provided a method for forming a contact plug of a semiconductor device, comprising the steps of: providing a substrate providing a plurality of conductive patterns, wherein the substrate has a first area and a second area lower than the first area and step difference exists between the first area and the second area; forming an insulating layer on the substrate; forming a plurality of contact hole by selectively etching the insulating layer; forming a conductive layer on the insulating layer and in the contact hole; removing the step difference between the first area and the second area by selectively removing the conductive layer in the first area; and forming an isolated plug in each contact hole by removing the conductive layer until a surface of the conductive layer is exposed.

In accordance with further another aspect of the present invention, there is provided a method for forming a contact plug of a semiconductor device, comprising the steps of: providing a substrate providing a plurality of conductive patterns, wherein the substrate has a first area and a second area lower than the first area and step difference exists between the first area and the second area; forming an insulating layer on the substrate; removing the step difference between the first area and the second area by selectively removing the insulating layer in the first area; forming a plurality of contact hole by selectively etching the insulating layer; forming a conductive layer on the insulating layer and in the contact hole; and forming an isolated plug in each contact hole by removing the conductive layer until a surface of the conductive layer is exposed.

In summary, after proceeding an etching process for forming a contact plug or pad, a double layer of a polysilicon layer and a tungsten layer commonly used as a conductive layer for the contact plug is deposited. Then, an etchback process via plasma or a Chemical mechanical polishing (CMP) process is employed to allow the conductive layer including parts of a metal layer located on an upper portion of a peripheral circuit area, i.e., a lowly dense pattern area, to be remained, and another CMP process is subsequently proceeded by using a slurry that can be applied for an effective etching of an oxide layer. The remaining conductive layer is particularly used as a sacrificial layer. Therefore, it is possible to prevent an excessive etching of the lowly dense pattern area even if an insulating layer in the lowly dense pattern area is has a thinner thickness.

Also, target thickness of the cell area and the peripheral circuit are can be equaled by selectively removing a conductive material layer for contact plug or an insulating layer in the cell area.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

FIGS. 2A to 2D are cross-sectional views illustrating a process for forming a contact plug of a semiconductor device in accordance with a first embodiment of the present invention.

Figure 1A:
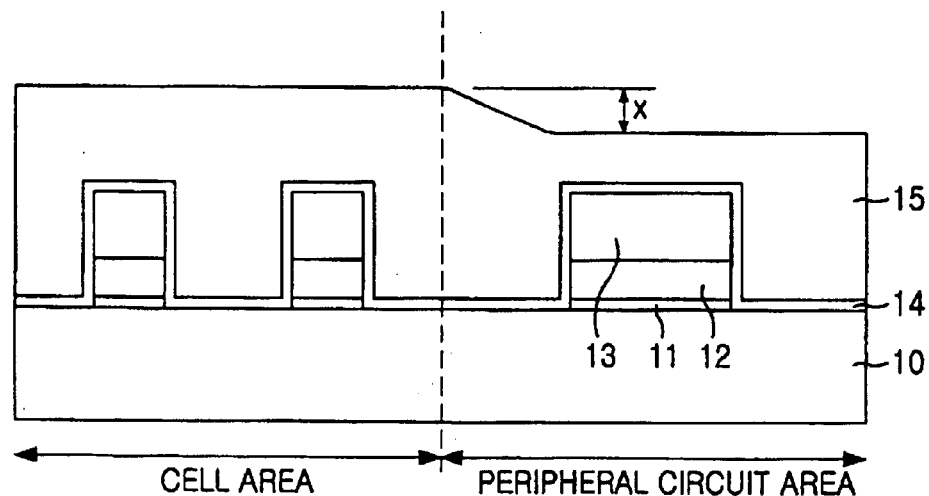
FIGS. 1A to 1C are cross-sectional views illustrating a process for forming a contact plug of a semiconductor device in accordance with a typical method.
Figure 1B:
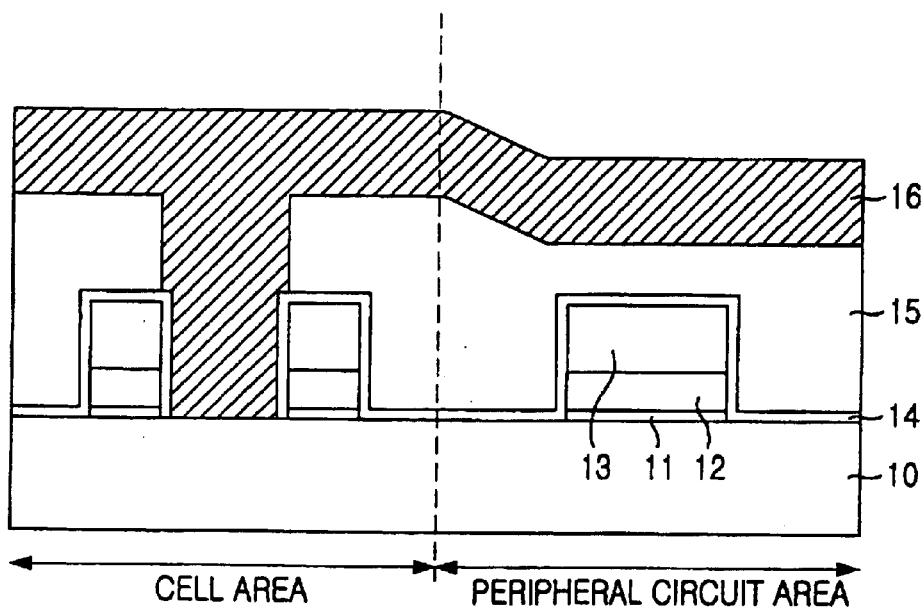
Figure 1C:
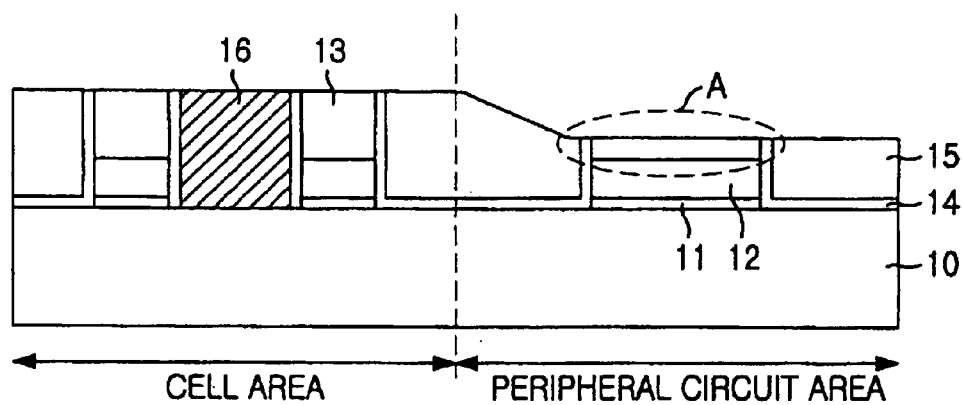
Figure 2A:
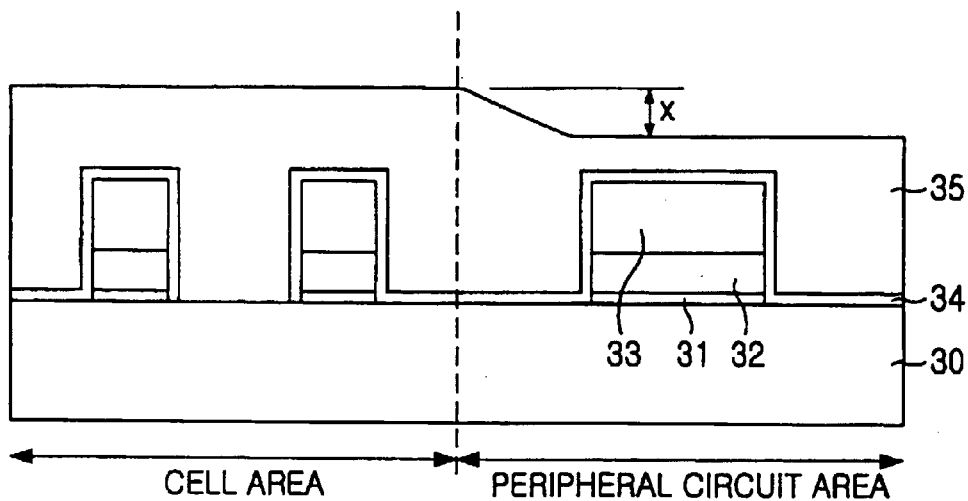
FIGS. 2A to 2D are cross-sectional views showing a process for forming a contact plug of a semiconductor device in accordance with a first embodiment of the present invention.

FIG. 2A represents a state in that a number of conductive patterns, e.g., gate electrode patterns in a cell area and a peripheral circuit area are formed. The contact plug formation process will be briefly explained in the following. Although the preferred embodiment of the present invention exemplifies the gate electrode pattern, in case of the bit line, it is also applicable for a process for forming a capacitor contact plug which is formed by being aligned in a bit line.

A semiconductor substrate 30 wherein various elements for fabricating a semiconductor device are prepared is divided into a cell area and a peripheral circuit area. On the substrate 10, a field oxide layer (not shown) is formed to classify an activation area and a device separation area through a local oxidation of silicon (hereinafter referred as to LOCOS) process or a shallow trench isolation (hereinafter referred as to STI) process.

A number of conductive patterns neighboring upon the activation area, e.g., a number of gate electrode patterns are formed. That is, an oxide layer based gate insulating layer 31 is deposited, and a gate electrode 32 is formed thereon by depositing a single or combinations of a metal layer using tungsten, a metal nitride layer using a tungsten nitride layer and a metal silicide such as tungsten silicide or polysilicon.

After the formation of the gate electrode 32, an insulating layer to be used for a nitride layer based hard mask is deposited.

Subsequently, a photoresist pattern (not shown) for forming the gate electrode pattern is formed. Afterwards, the insulating layer to be used for a nitride layer based hard mask, the gate electrode material and the gate oxide layer are selectively etched by using the gate electrode pattern as an etching mask so as to form the gate electrode pattern in a stack structure including the gate insulating layer 31, the gate electrode 32 and the hard mask 33. Herein, a thickness of the hard mask 33 in each of the cell area and the peripheral circuit area is depicted as identical to each other. However, in a practical application of the process, a self align contact (hereinafter referred as to SAC) process is proceeded only in the cell area, and thus, the thickness of the hard mask 33 in the peripheral circuit area is generally lower than approximately 500 Å.

Along an overall profile wherein the gate electrode pattern is formed, a nitride layer based insulating layer 34 to be used for a spacer is thinly deposited. Herein, the reason for using the nitride based material is to provide an etching selection ratio with the oxide layer during a SAC etching process for forming a contact plug and prevent losses of the gate electrode pattern when performing the etching process.

In continuous to the deposition of the nitride layer based insulating layer 34, a boro phospho silicate glass (BPSG) layer is deposited to form another insulating layer 35 for insulating an inter-layer by sufficiently covering the gate electrode pattern and an upper part of the substrate 30. Meanwhile, since the peripheral circuit area has a lower vertical height than the cell area because of a difference in densities of patterns in the cell area and the peripheral circuit area, there results in a step difference between the two areas as denoted X in FIG. 2A.

Herein, although the preferred embodiment of the present invention exemplifies the cell area and the peripheral circuit area having the step difference, the step difference actually comes from a highly densified integrated pattern area and a relatively lowly densified integrated pattern area. Also, the insulating layer 35 can use other types of materials such as a high temperature oxide (HTO) layer, a medium temperature oxide (MTO) layer, a high density plasma (HDP) layer, a tetra ethyl ortho silicate (TEOS) layer or an advanced planarization layer (APL) in addition to the BPSG layer.

Figure 2B:
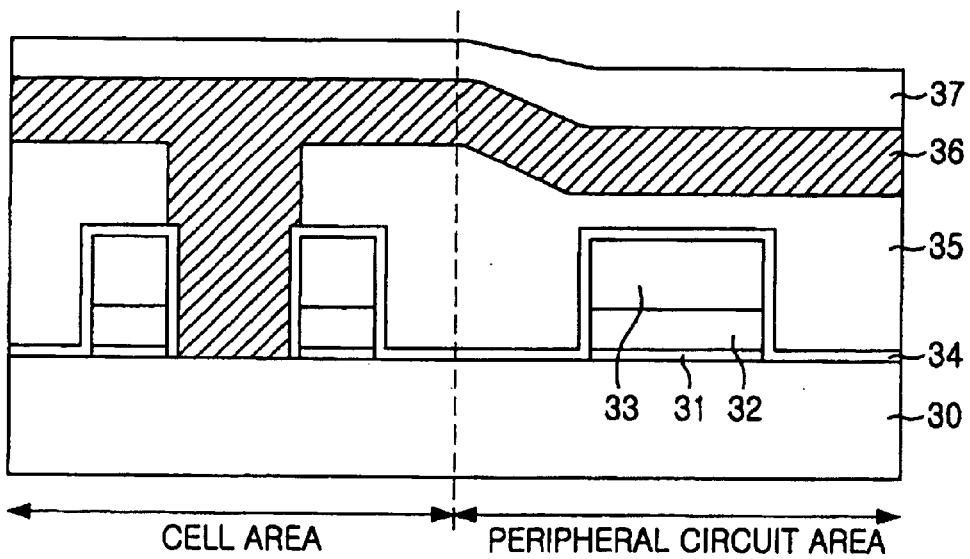

Next, a cell contact open mask (not shown) for forming a contact plug for electrically contacting devices, which will be formed on an upper structure of the substrate 30 through a subsequent process, is formed on the semiconductor substrate 30 between the gate electrode patterns, more particularly, the activation area. Then, the insulating layer is selectively etched by using the cell contact open mask as an etching mask so as to form a contact hole for opening a surface of the substrate 30 between the gate electrode patterns. A conductive material, e.g., polysilicon doped with impurities is deposited as sufficient as to contact to the opened surface of the substrate 30 and fill the contact hole so that a contact plug 36 is eventually formed. A metal such as tungsten (W), titanium (Ti), chromium (Cr) or molybdenum (Mo), a metal nitride layer such as a tungsten nitride layer or a metal silicide such as tungsten silicide is deposited to form a metal sacrificial layer 37. FIG. 2B is a cross-sectional view illustrating the above described process.

At this time, it is preferable to form the metal sacrificial layer 37 with a thickness that allows the step difference X to be sufficiently covered.

Meanwhile, fluorine based plasma commonly used for the typical SAC process, i.e., $C_xF_y$, where x and y are from 1 to 10, for instance, $C_2F_4$, $C_2F_6$, $C_3F_8$, $C_4F_6$, $C_5F_8$ or $C_5F_{10}$ is used as a main etching gas when etching the insulating layer 35, and a gas for producing a polymer during the SAC process, that is, $C_3HF_5$ or $CHF_3$ is added to the main etching gas. At this time, such an inert gas as He, Ne, Ar or Xe is used as a carrier gas.

Therefore, the contact plug 36 yet has a step difference since it is formed along the profile containing the step difference between the two areas originated from the difference in pattern densities of the cell area and the peripheral circuit area.

Herein, the cell contact open mask can be implemented with a hole-type, a bar-type or a T-type.

In case of the typical method, the planarization process is uniformly applied to the contact plug 36 by taking the cell area as a basis for an etching target with regardless of the step difference between the two areas. Because of this uniformly applied planarization process, there results in an attack to the gate electrode pattern in the peripheral circuit area. For this reason, in the preferred embodiment of the present invention, the planarization process is applied twice with use of the metal sacrificial layer 37 to solve the problem of different etching rate caused by the step difference between the cell area and the peripheral circuit area.

Figure 2C:
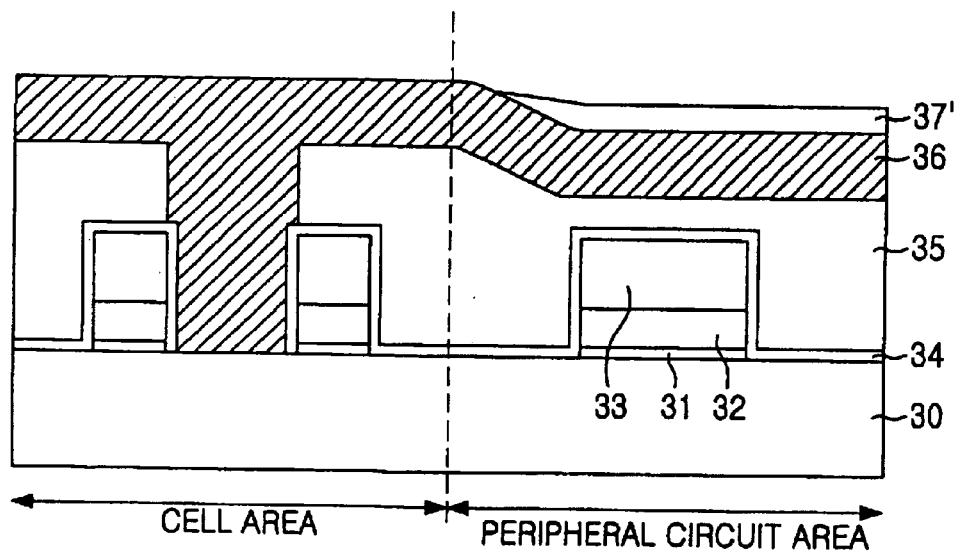

FIG. 2C represents the preferred embodiment wherein the planarization process is applied twice. An etchback process or a chemical mechanical polishing (hereinafter referred as to CMP) process is performed with a condition that the metal sacrificial layer 37 in the cell area is almost removed so that the contact plug 36 formed with polysilicon is exposed in the cell area. On the other hand, the metal sacrificial layer 37' in the peripheral circuit area having a lower topology is remained.

Accordingly, each of the etching target located in the cell area, a highly dense pattern area, and the peripheral circuit area, a lowly dense pattern area, become nearly identical when applying a subsequent CMP process and the plug isolation process.

Figure 2D:
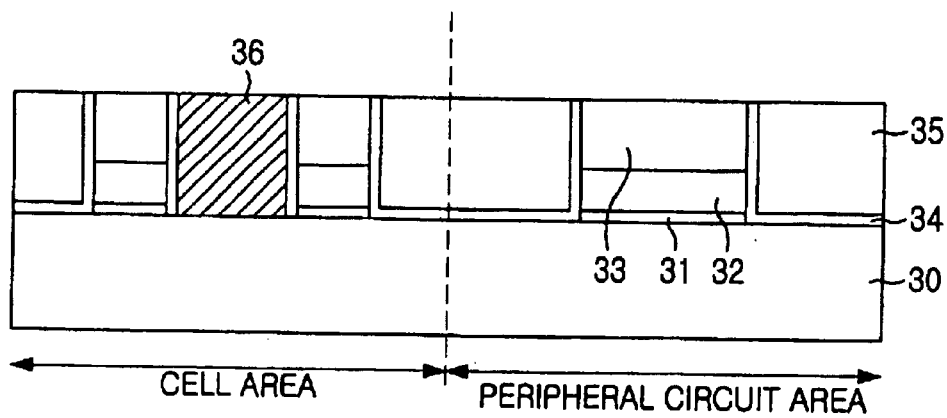

Next, as illustrated in FIG. 2D, the subsequent CMP process for isolating each contact plug 36 is carried out so as to planarize the contact plug 36 and the insulating layer 35.

At this time, it is possible to planarize the contact plug 36 and the insulating layer 35 with the hard mask 33 or a certain portion of the insulating layer 35. The peripheral circuit area has the insulating layer 35 of which thickness is thinner than that in the cell area. Additionally, the insulating layer 35 is an oxide layer based layer. As a result, a slurry that is useful for an effective etching of the oxide layer during the CMP process is especially employed.

Consequently, it is possible to prevent the attack to the gate electrode pattern and simultaneously planarize and isolate the contact plug 36.

Figure 3A:
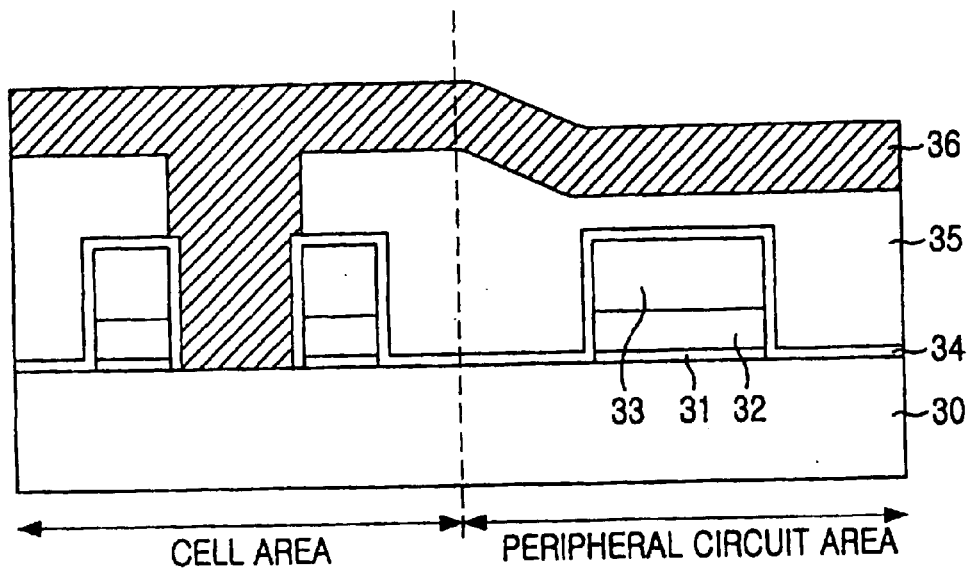
FIGS. 3A to 3C are cross-sectional views showing a process for forming a contact plug of a semiconductor device in accordance with a second embodiment of the present invention.
Figure 3B:
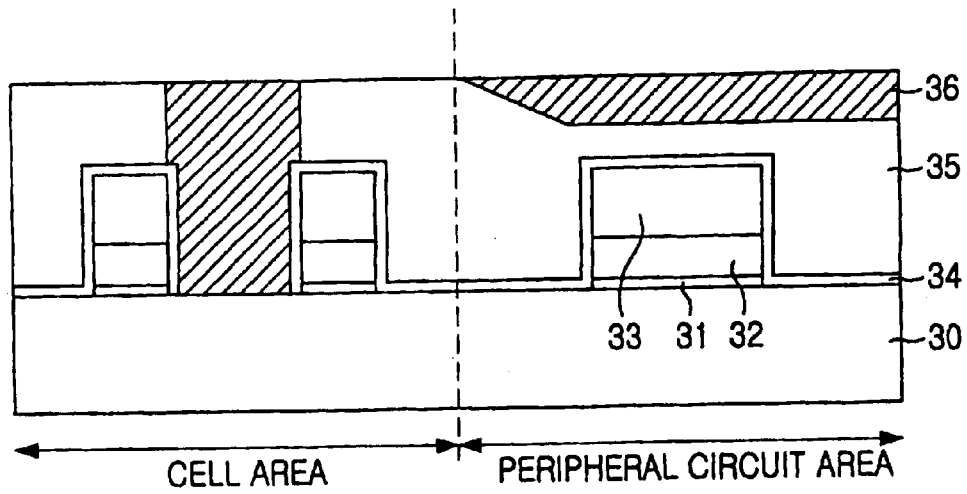
Figure 3C:
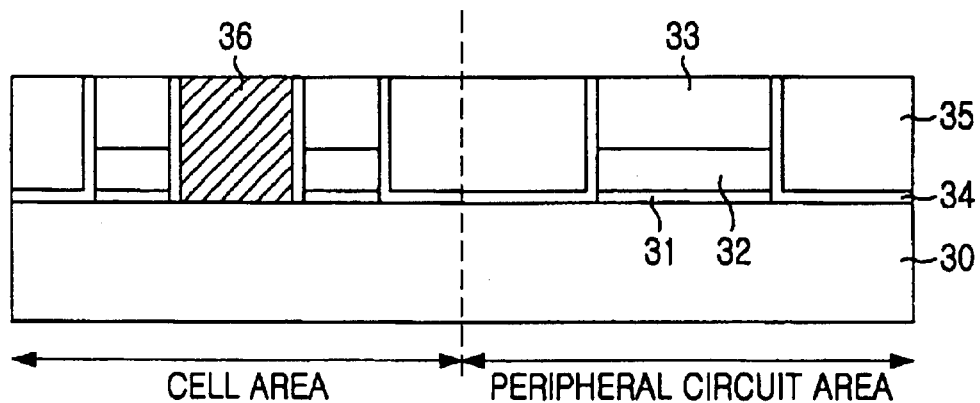

FIGS. 3A to 3C are cross-sectional views illustrating a process for forming a contact plug of a semiconductor device in accordance with a second embodiment of the present invention.

Referring to FIG. 3A, an insulating layer 35 is formed on a semiconductor substrate including a peripheral circuit area which is a lower than a cell area because of a difference in densities of patterns in the cell area and the peripheral circuit area. Then, the insulating layer 35 is selectively etched so as to form a contact hole for opening a surface of the substrate 30 between the gate electrode patterns. A conductive material, e.g., polysilicon doped with impurities is deposited as sufficient as to contact to the opened surface of the substrate 30 and fill the contact hole so that a contact plug 36 is eventually formed.

Referring to FIG. 313, the conductive material for the contact plug 36 is removed until the surface of the insulating layer 35 in the cell area is exposed and the cell area and the peripheral circuit area have equal height. That is, the step difference between the cell area and the peripheral area is removed.

Referring to FIG. 3C, a CMP process for isolating each contact plug 36 is carried out so as to planarize the contact plug 36 and the insulating layer 35. At this time, it is possible to planarize the contact plug 36 and the insulating layer 35 with the hard mask 33 or a certain portion of the insulating layer 35.

Consequently, it is possible to prevent the attack to the gate electrode pattern and simultaneously planarize and isolate the contact plug 36.

Figure 4:
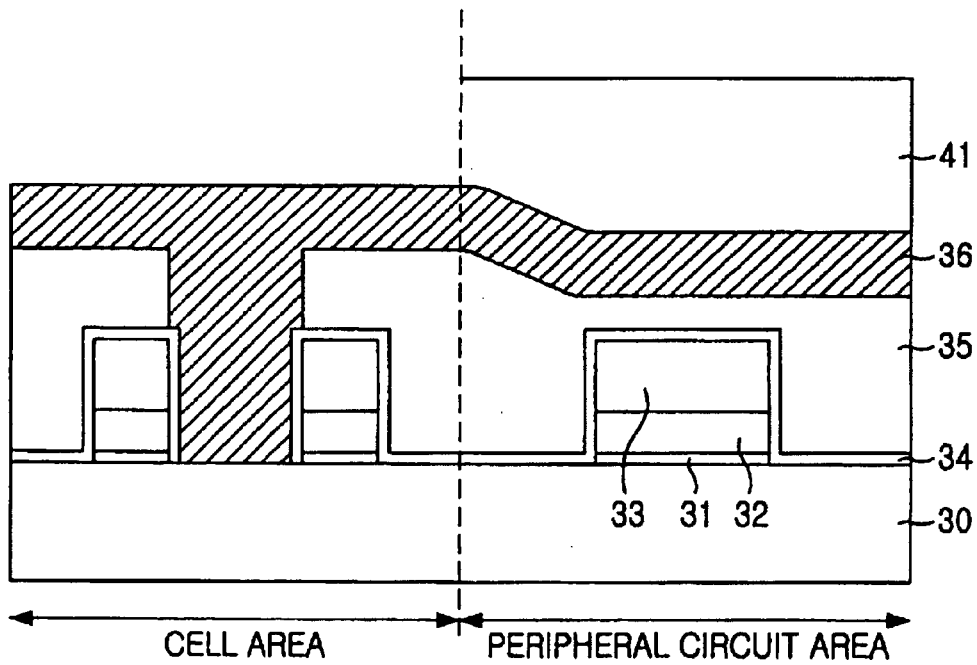
FIG. 4 is a cross-sectional view showing a process for forming a contact plug of a semiconductor device in accordance with a third embodiment of the present invention.

FIG. 4 is a cross-sectional view illustrating a process for forming a contact plug of a semiconductor device in accordance with a third embodiment of the present invention.

Referring to FIG. 4, an insulating layer 35 is formed on a semiconductor substrate including a peripheral circuit area which is a lower than a cell area because of a difference in densities of patterns in the cell area and the peripheral circuit area. Then, the insulating layer 35 is selectively etched so as to form a contact hole for opening a surface of the substrate 30 between the gate electrode patterns. A conductive material, e.g., polysilicon doped with impurities is deposited as sufficient as to contact to the opened surface of the substrate 30 and fill the contact hole so that a contact plug 36 is eventually formed.

Then, a mask pattern 41 covering the peripheral circuit area is formed, and the conductive material for the contact plug in the cell area is etched in order to remove the step difference between the cell area and the peripheral area.

Thereafter, a CMP process for isolating each contact plug 36 is carried out so as to planarize the contact plug 36 and the insulating layer 35 as shown in FIG. 3D.

Consequently, it is possible to prevent the attack to the gate electrode pattern and simultaneously planarize and isolate the contact plug 36.

Figure 5A:
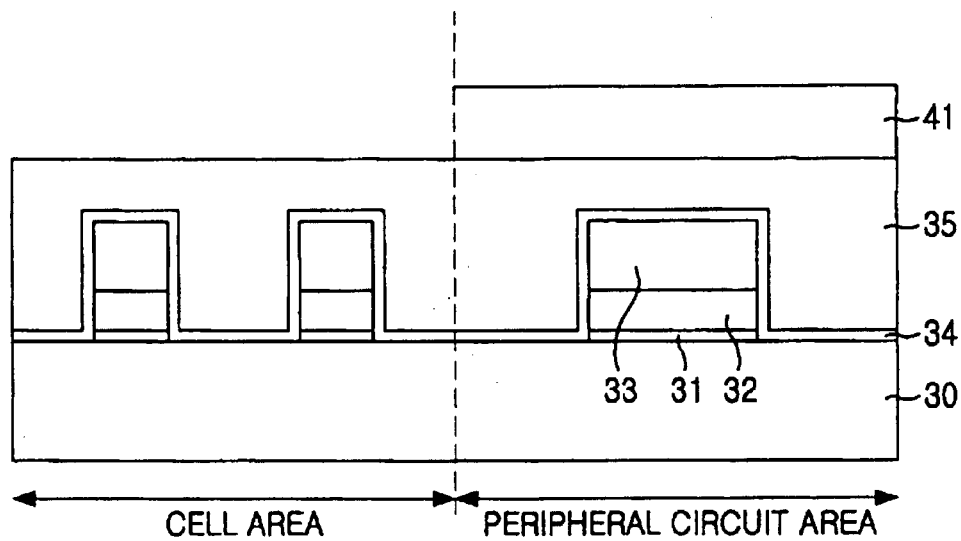
FIGS. 5A to 5C are cross-sectional views showing a process for forming a contact plug of a semiconductor device in accordance with a fourth embodiment of the present invention.
Figure 5B:
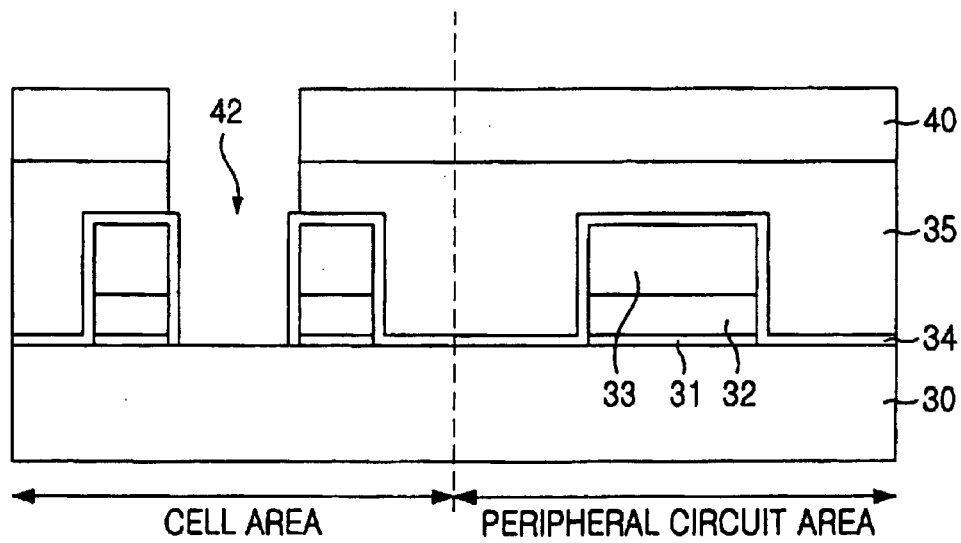
Figure 5C:
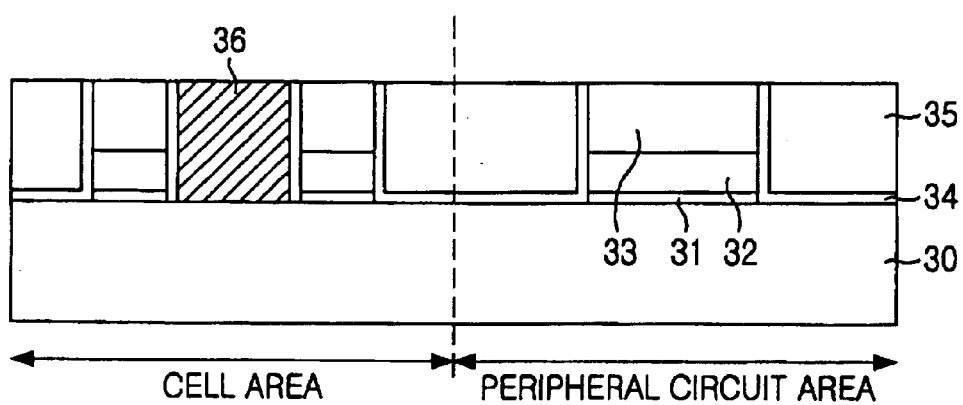

FIGS. 5A to 5C are cross-sectional views illustrating a process for forming a contact plug of a semiconductor device in accordance with a fourth embodiment of the present invention.

Referring to FIG. 5A, an insulating layer 35 is formed on a semiconductor substrate including a peripheral circuit area which is a lower than a cell area because of a difference in densities of patterns in the cell area and the peripheral circuit area. Then, a mask pattern 41 covering the peripheral circuit area is formed on the insulating layer 35.

Then, the insulating layer 35 in the cell area is selectively etched so as to remove the step difference between the cell area and the peripheral area.

Referring to FIG. 5B, after removing the mask pattern 41, a contact hole mask pattern 40 is formed. Then, the insulating layer 35 is selectively etched so as to form a contact hole for opening a surface of the substrate 30 between the gate electrode patterns. A conductive material, e.g., polysilicon doped with impurities is deposited as sufficient as to contact to the opened surface of the substrate 30 and fill the contact hole so that a contact plug 36 is eventually formed. Thereafter, a CMP process for isolating each contact plug 36 is carried out so as to planarize the contact plug 36 and the insulating layer 35 as shown in FIG. 3D.

Consequently, it is possible to prevent the attack to the gate electrode pattern and simultaneously planarize and isolate the contact plug 36.

As described above, the preferred embodiment of the present invention demonstrates that the metal sacrificial layer is used to overcome the step difference between the highly densified integrated pattern area and the lowly densified integrated pattern area, thereby providing substantially identical target thickness for the planarization process carried out for planarizing the step difference between the two areas. By using the slurry accordingly when performing the CMP process, it is possible to prevent the attack to the bottom structures located in the lowly densified integrated area. Also, target thickness of the cell area and the peripheral circuit are can be equaled by selectively removing a conductive material layer for contact plug or an insulating layer in the cell area. Ultimately, by following the preferred embodiments of the present invention, it is possible to enhance a process margin and yields for fabricating a semiconductor device.

While the present invention has been described with respect to certain preferred embodiments, it will be apparent to those skilled in the art that various changes and modifications may be made without departing from the scope of the invention as defined in the following claims.

What is claimed is:

1. A method for forming a contact plug of a semiconductor device, comprising the steps of:

forming a plurality of conductive patterns on a substrate;

forming an insulating layer on top of an entire structure including the plurality of the conductive pattern;

forming a contact hole by selectively etching the insulating layer;

forming a conductive layer for a contact plug on the entire structure including the contact hole;

forming a metal sacrificial layer on the entire structure including the conductive layer;

exposing the conductive layer by performing an etchback process to the metal sacrificial layer, wherein the metal sacrificial layer is left on a lower topology area induced by the conductive patterns; and forming plugs, each being isolated by polishing the remained metal sacrificial layer, the conductive layer and the insulating layer through the use of slurry.

2. The method as recited in claim 1, wherein the metal sacrificial layer includes any one material selected from a group of tungsten, titanium, chromium, and molybdenum.

3. The method as recited in claim 1, wherein the conductive layer to be used for the contact plug includes polysilicon or tungsten.

4. The method as recited in claim 1, wherein the lower topology area is a peripheral circuit area in a semiconductor device and a relatively high topology area is a cell area in the semiconductor device.

5. The method as recited in claim 1, wherein the insulating layer includes any one matter selected from a group of a boro phospho silicate glass (BPSG) layer, a high temperature oxide (HTO) layer, a medium temperature oxide (MTO) layer, a high density plasma (HDP) oxide layer, a tetra ethyl ortho silicate (TEOS) layer and an advanced planarization layer (APL).

6. The method as recited in claim 1, wherein the conductive pattern is a conductive line including a gate electrode or a bit line.

7. The method as recited in claim 1, wherein the contact hole have any one form among a bar-type, a T-type or a hole-type.

* * * * *